United States Patent [19]
Radosevich et al.

[11] Patent Number: 5,654,581
[45] Date of Patent: Aug. 5, 1997

[54] INTEGRATED CIRCUIT CAPACITOR

[75] Inventors: Joseph Rudolph Radosevich, Orlando, Fla.; Ranbir Singh, Macungie, Pa.

[73] Assignee: Lucent Technologies Inc., Murray Hill, N.J.

[21] Appl. No.: 472,033

[22] Filed: Jun. 6, 1995

Related U.S. Application Data

[62] Division of Ser. No. 353,015, Dec. 9, 1994, Pat. No. 5,508,415.

[51] Int. Cl.$^6$ ........................................ H01L 29/00
[52] U.S. Cl. .................. 257/534; 257/301; 257/304; 257/535
[58] Field of Search ..................... 257/296, 300, 257/301, 303, 304, 305, 532, 534, 535

[56] References Cited

U.S. PATENT DOCUMENTS

| | | |
|---|---|---|
| 4,855,952 | 8/1989 | Kiyosumi . |
| 5,005,102 | 4/1991 | Larson ........................... 361/313 |
| 5,065,220 | 11/1991 | Paterson et al. . |
| 5,089,869 | 2/1992 | Matsuo et al. . |
| 5,101,251 | 3/1992 | Walcamiya et al. . |
| 5,195,017 | 3/1993 | McDonald . |
| 5,244,825 | 9/1993 | Coleman et al. . |
| 5,290,729 | 3/1994 | Hayashide et al. . |
| 5,300,450 | 4/1994 | Shen et al. . |
| 5,304,506 | 4/1994 | Porter et al. . |
| 5,307,310 | 4/1994 | Narita ........................... 365/149 |
| 5,312,769 | 5/1994 | Matsuo et al. . |
| 5,326,724 | 7/1994 | Wei . |
| 5,338,701 | 8/1994 | Hsu et al. . |
| 5,340,765 | 8/1994 | Dennison et al. . |
| 5,418,388 | 5/1995 | Okudaira et al. .......... 257/295 |
| 5,436,477 | 7/1995 | Hashizume et al. ........ 257/310 |
| 5,478,772 | 12/1995 | Fazan ........................... 437/60 |

*Primary Examiner*—Ngân V. Ngô

[57] ABSTRACT

An integrated circuit with a capacitor includes a conductive substrate, a layer of field dielectric formed on the conductive substrate, a layer of conductive metal or conductive polycrystalline silicon formed on the field dielectric, and first and second laterally spaced apart layers of conductive material formed on the conductive metal or polycrystalline silicon. Each spaced apart layer preferably includes a layer of titanium nitride disposed over a layer of titanium. A layer of capacitor dielectric is deposited on the first of the spaced apart layers, and metal is deposited over the capacitor dielectric and the second layer of conductive material.

4 Claims, 4 Drawing Sheets

INTEGRATED CIRCUIT CAPACITOR

This is a divisional of application Ser. No. 08/353,015 filed Dec. 9, 1994, now U.S. Pat. No. 5,508,415.

BACKGROUND OF THE INVENTION

1. Field of the Invention

The present invention relates to a method for fabricating a capacitor, and more particularly, to a method for fabricating a metal to metal capacitor in an integrated circuit.

2. Background of the Art

Capacitors are used extensively in electronic devices for storing an electric charge. The capacitors essentially comprise two conductive plates separated by an insulator. The capacitance, or amount of charge held by the capacitor per applied voltage, is measured in farads and depends upon the area of the plates, the distance between them, and the dielectric value of the insulator. Capacitors are used in filters, in analog-to-digital converters (ADCs), in memories, and various control applications.

Capacitors in integrated circuits are usually fabricated from polysilicon, metal to polysilicon or metal to polycide structures. In most applications, such as in analogue to digital converters (ADC's), one needs capacitors whose capacitance does not vary with voltage. A measure of the variation of capacitance with applied voltage is called the voltage coefficient of capacitance (VOC) measured in parts per million. Generally, VOC of capacitors used on integrated circuits is not zero (50–300 ppm) and hence needs to be nulled. Circuit techniques that employ null methods assume that the variation of VOC with voltage, while not zero, is a linear function of voltage, which is not a valid assumption in integrated circuit capacitors. Furthermore, while these techniques increase precision and resolution of ADC's they consume chip area, and hence increase chip cost. If the VOC of the capacitors is less than a few ppm one does not need to employ null circuit techniques, thereby reducing circuit complexity and cost.

U.S. Pat. No. 5,108,941 to Paterson et al. discloses a method of making a metal to polysilicon type capacitor having a low VOC as compared to polysilicon type capacitors. In the Paterson et al. method the bottom plate of the capacitor is formed over a field oxide structure, and the multilevel dielectric is deposited thereover. The multilevel dielectric is removed from the capacitor area, and an oxide/nitride dielectric is deposited over the exposed bottom plate and over the multilevel by way of low pressure chemical vapor deposition ("LPCVD"). A first layer of titanium/tungsten is preferably deposited prior to contact etch, and the contacts to moat and unrelated polysilicon are formed. Metallization is sputtered overall, and the metal and titanium/tungsten are cleared to leave the metallization filling the contact holes, and a capacitor having a titanium/tungsten and metal top plate.

In any fabrication process, simplicity is an advantage. Thus, a fabrication method which can achieve the same or better quality product with the same cost of materials while using fewer steps is highly preferred, especially if elimination of fabrication steps reduces labor costs and the need for expensive manufacturing equipment. A new structure built from materials already being used in the fabrication process is preferred since it reduces materials development efforts and the need for expensive manufacturing equipment.

Moreover it is desirable to have flexibility in the processing steps for fabricating integrated circuits. Particularly, it is highly advantageous to have a modular process for forming a capacitor, i.e. a process that can be added as an option to an existing digital process with no changes in sequence operations. Employing a silicided metal on polysilicon ("polycide") as contemplated in U.S. Pat. No. 5,108,941 entails siliciding the entire polysilicon layer to achieve the optimum voltage stability. However, siliciding sharply reduces processing flexibility. For example, with a silicided structure heat treatment of the integrated circuit for such purposes as annealing, diffusion, driving in dopants, smoothing interlevel dielectrics and the like, is limited to temperatures below about 850° C. It would be advantageous to be able to use temperatures above 850° C. and to be able to form low VOC capacitors at various stages of integrated circuit fabrication.

SUMMARY OF THE INVENTION

A low VOC metal to metal capacitor and a method for making same in an integrated circuit are provided herein. The method includes forming a field dielectric layer on a conductive substrate; forming a bottom plate of the capacitor comprising a layer of first metal in electrical contacting relation with said conductive polysilicon layer; forming a layer of capacitor dielectric in contact with said bottom plate of said capacitor; and forming a top plate of the capacitor comprising a layer of second metal onto said capacitor dielectric.

The bottom plate preferably comprises a layer of titanium with an overlayer of titanium nitride. The top plate is preferably aluminum. And the capacitor dielectric is preferably silicon dioxide or oxide/dielectric Preferably, the method further comprises forming a conductive polycrystalline silicon layer in contact with said field dielectric layer and depositing a pattern of interlevel dielectric (e.g., silicon dioxide) on the conductive polycrystalline silicon layer prior to forming the bottom plate of the capacitor.

BRIEF DESCRIPTION OF THE DRAWINGS

So that one skilled in the art to which the subject invention appertains will better understand how to practice the method of the present invention, preferred embodiments of the method will be described in detail hereinbelow with reference to the drawings wherein.

DETAILED DESCRIPTION OF PREFERRED EMBODIMENTS

Figure 1:
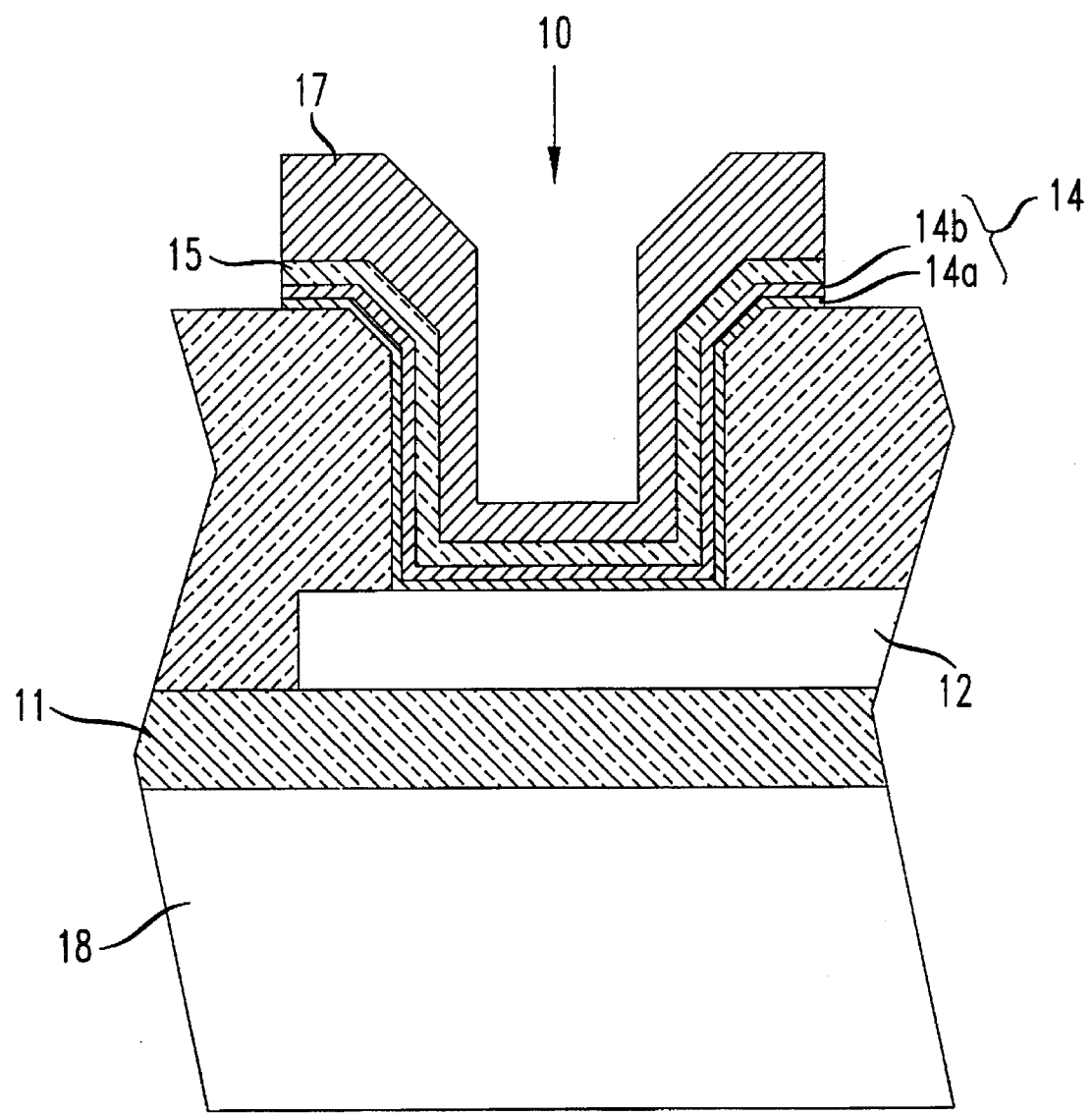
FIG. 1 is a cross sectional diagram of the capacitor 10 of the present invention.

FIG. 1 is a cross-sectional diagram of the metal to metal capacitor 10 constructed according to the method described herein. The capacitor 10 comprises a lower plate 14, dielectric layer 15, and upper plate 17. These layers are optionally stacked on top of a polycrystalline silicon ("polysilicon") layer 12, which is formed on top of field oxide ("FOX") dielectric layer 11 disposed on a silicon substrate 18. The substrate 18 may be a p-type or n-type silicon.

Lower plate 14 of the capacitor 10 can be formed from any metal suitable for conducting and holding an electric charge, such as aluminum, copper, silver, titanium, or noble metals such as gold, platinum, palladium, and the like. Preferably, lower plate 14 is a multilayered structure comprising layer 14a of titanium (Ti) overcoated with layer 14b of titanium nitride (TiN). Layer 14 may range in thickness from about 0.04 microns to about 0.15 microns, with the Ti layer 14a ranging in thickness from about 0.01 microns to about 0.05 microns, and the TiN layer ranging in thickness from about 0.03 microns to about 0.10 microns.

Layer 15 can be formed from any suitable dielectric, such as silicon dioxide ($SiO_2$) and/or silicon nitride and can generally range in thickness from about 0.01 microns to about 0.10 microns depending on the electrical requirements of the capacitor.

The top plate 17 of the capacitor can be any metal suitable for fabricating capacitors on integrated circuits. Aluminum is a preferred metal for fabricating top plate 17. The aluminum may optionally be doped with, for example, copper or silicon, or alternatively may be part of a multilayered metal system.

The method of making a metal to metal capacitor 10 having a very low VOC is illustrated in FIGS. 2 to 6.

Figure 2:
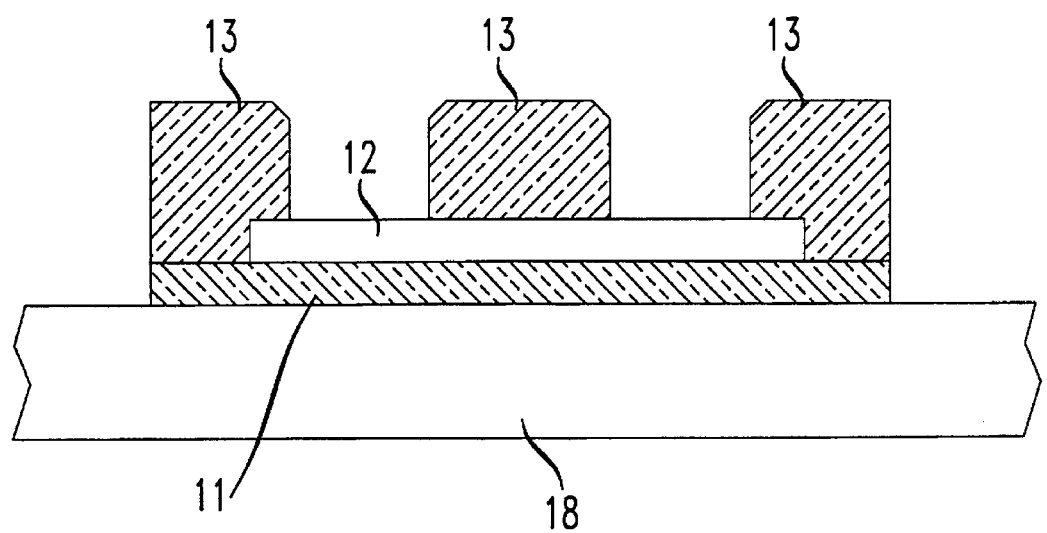
FIGS. 2 to 6 are cross-sectional diagrams illustrating various steps in the formation of the capacitor of the present invention.

Referring to FIG. 2, a plate of polysilicon. 12 is patterned over a layer 11 of field oxide ($SiO_2$). The field oxide layer 11 is formed on the silicon substrate 18 in a manner well known in the art, such as local oxidation or by deposition. Likewise, patterning of polysilicon is well known in the art. Then, interlevel dielectrics 13 are deposited in an appropriate pattern to insulate the polysilicon layer 12 from overlying metallization. The interlevel dielectric 13 is preferably silicon dioxide, which may optionally be doped, or may optionally also be silicon nitride or any other material having properties suitable for the use described herein. The structure at this point is as diagrammed in FIG. 2.

The polysilicon 12 is preferably heavily doped to be relatively conductive, as in conventional integrated circuits. Generally the polysilicon layer will be n-doped either by diffusion, ion implantation, or by in-situ doping. It should be noted that polysilicon layer 12 does not serve as the bottom plate of capacitor 10 and hence is optional. However, it serves as a lead to conduct electric charge to and from the bottom layer 14 and thereby facilitates the incorporation of capacitor 10 into an integrated circuit. In contrast to the method disclosed in U.S. Pat. No. 5,108,941 the polysilicon layer 12 herein does not need to be silicided to achieve optimum VOC performance of the capacitor 10. Moreover, other conductive materials may be substituted for polysilicon, such as aluminum, copper, silver, titanium, or noble metals such as gold, platinum, palladium, and the like.

Figure 3:
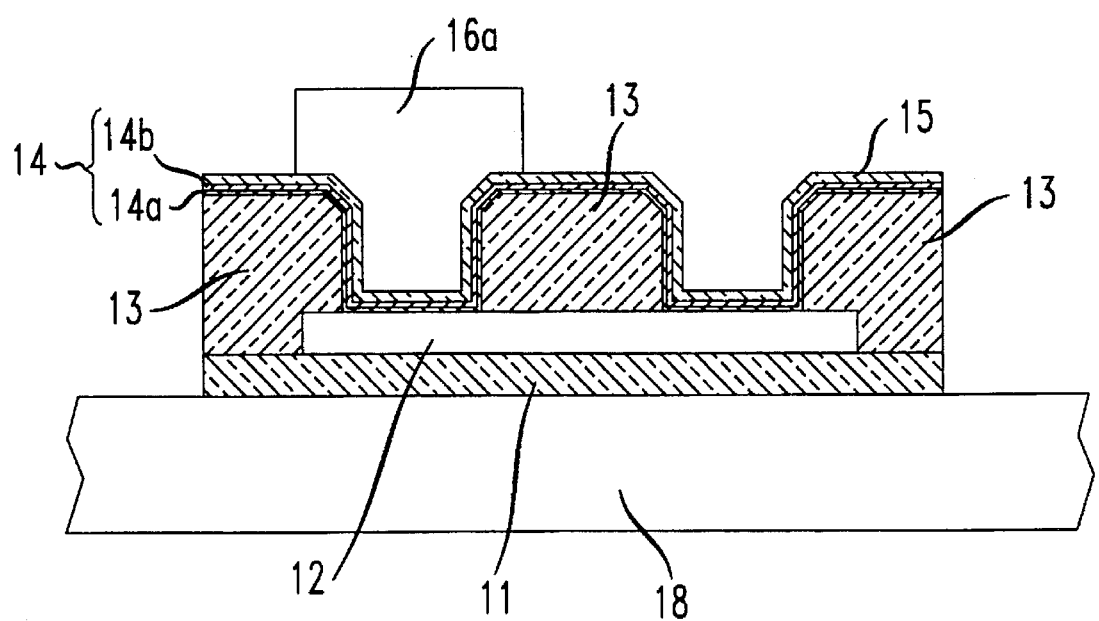

Referring to FIG. 3, a bottom plate 14 is formed by depositing a layer 14a of titanium (Ti) and 14b of titanium nitride (TiN), preferably by sputter deposition. The titanium nitride may be deposited in-situ after a certain thickness of titanium metal has been deposited by bleeding nitrogen gas into the titanium sputtering chamber. Thus, the titanium nitride forms a coating which covers the titanium and serves as an etch stop for later processing steps as discussed below.

Next, the capacitor dielectric 15 is deposited. The dielectric is formed by first depositing tetraethoxysilane ("TEOS") on the layer 14 of Ti/TiN by means of chemical vapor deposition ("CVD") or plasma enhanced chemical vapor deposition ("PECVD"). The TEOS decomposes to form an adherent layer 15 of $SiO_2$. Although the capacitor dielectric is described herein as being silicon dioxide, it should be understood that other materials can also function as capacitor dielectrics. For example, the capacitor dielectric 15 can be formed from silicon nitride or ferroelectric material such as $BaTiO_3$. Following this, the capacitor is then masked using a photoresist 16a, which is used to delineate the edges of the capacitor 10. The structure at this point is as diagrammed in FIG. 3.

Figure 4:
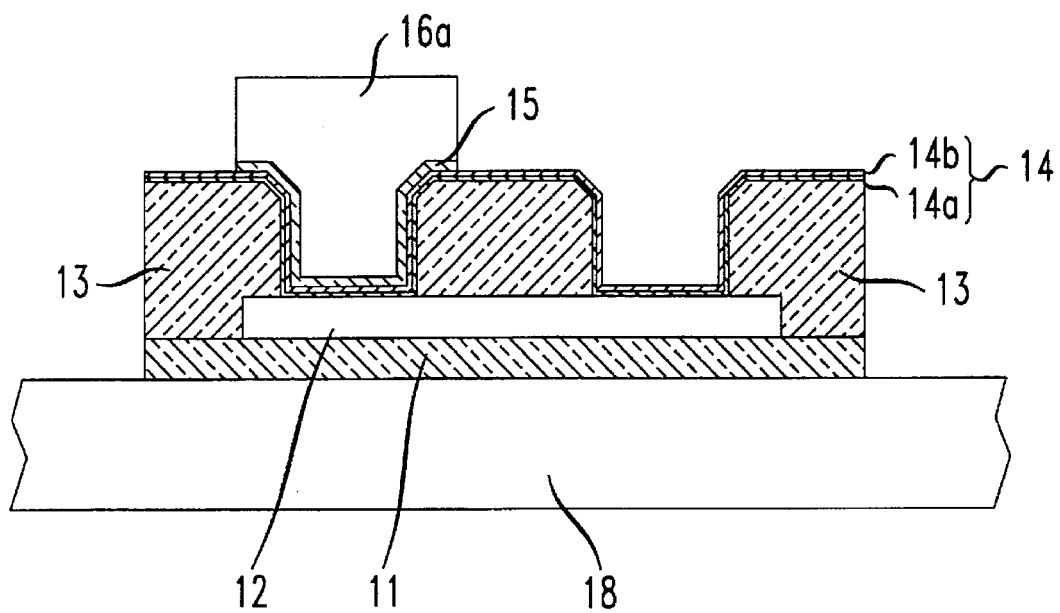
Figure 5:
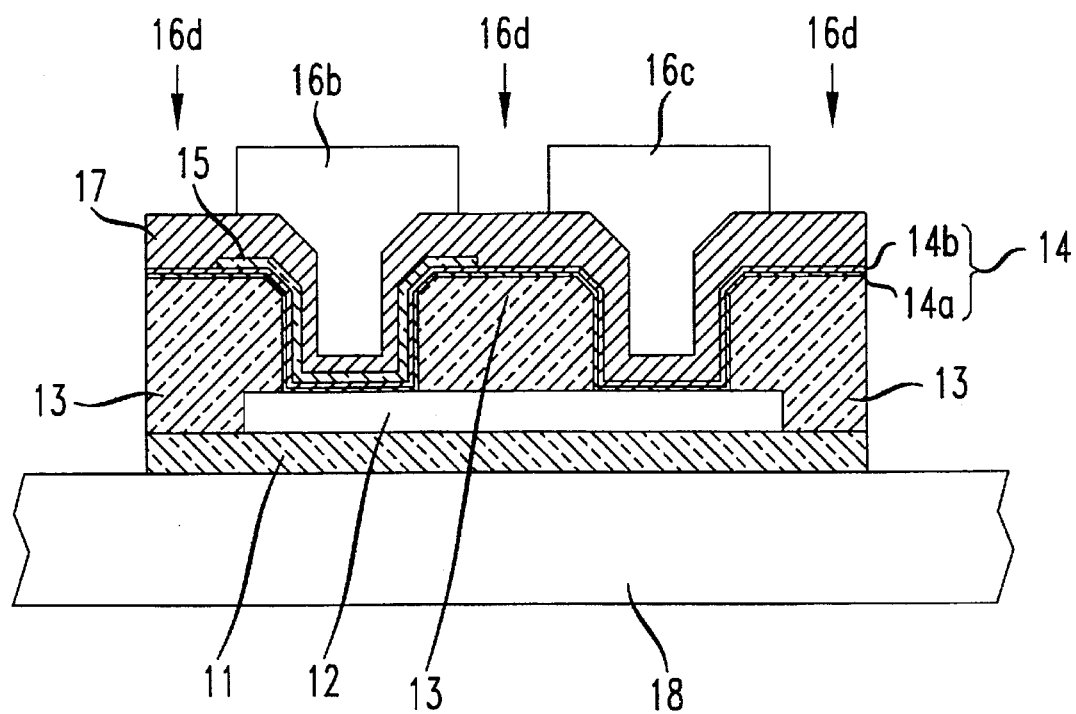

Referring to FIG. 4, capacitor dielectric layer 15 is etched away with, for example, when the dielectric is silicon dioxide, a wet etch such as ethylene glycol/buffered hydrogen fluoride solution, or a dry etch such as reactive sputter etching. The TiN is resistant to such etches and functions as an etch stop. The structure at this point is as diagrammed in FIG. 4.

In the next step the photo resist 16a is stripped off and a layer 17 of aluminum ("Al") is deposited. The capacitor 10 is formed in the areas with the remaining capacitor dielectric in which the capacitor layers are titanium-titanium nitride-silicon dioxide-aluminum.

Next, the aluminum layer 17 is patterned with masking material, i.e. photoresist portions 16b and 16c, which are exposed and developed in accordance with conventional photolithography techniques to define gaps 16d for exposing the surface of the integrated circuit to an etchant. The photoresist portion 16b, which defines the limits of the capacitor 10, should terminate on the oxide 15. The resulting structure is as diagrammed in FIG. 5.

Figure 6:
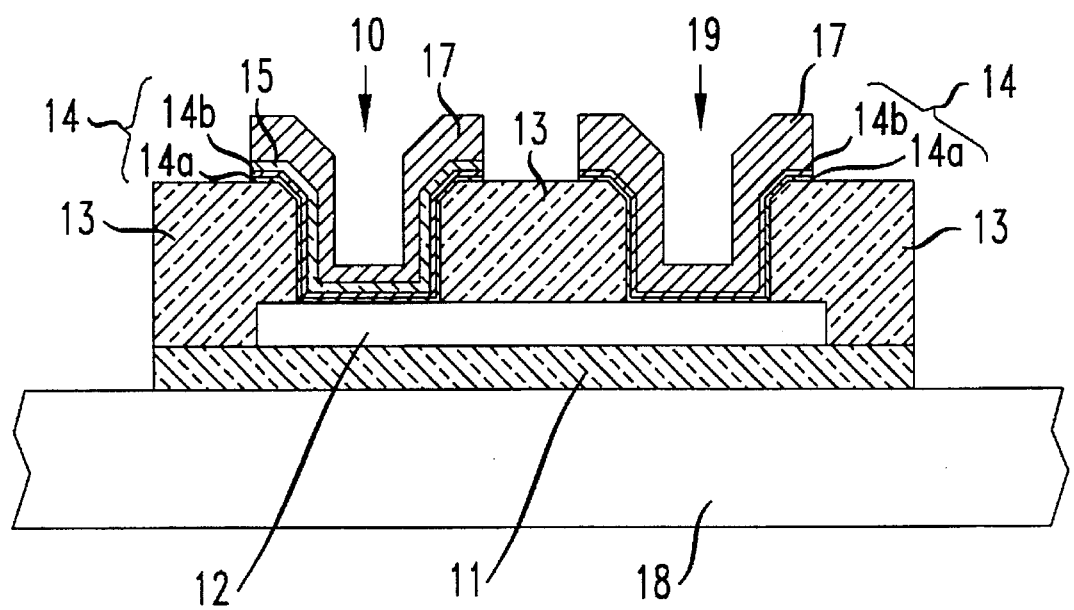

Finally, the aluminum is over-etched sufficiently to remove dielectric 15 and the titanium-titanium nitride underlayer 14 positioned at the gaps 16d. Then the photoresist portions 16b and 16c are stripped. The resulting structure is as shown in FIG. 6. Structure 19 is a contact via containing conductive layers of aluminum 17 Ti/TiN 14 and provides electrical access to bottom plate 14 of the capacitor 10 through the polysilicon layer 12.

Although the subject invention has been described with respect to preferred embodiments, it will be readily apparent to those having ordinary skill in the art to which it appertains that changes and modifications may be made thereto without departing from the spirit or scope of the subject invention as defined by the appended claims.

What is claimed is:

1. An integrated circuit comprising:
   a) a conductive substrate;
   b) a layer of field dielectric formed on said conductive substrate;
   c) a layer of conductive polycrystalline silicon formed on said layer of field dielectric;
   d) first and second laterally spaced apart layers of conductive material formed on said layer of polycrystalline silicon and in electrically conductive relation therewith, each of said spaced apart first and second layers comprising a layer of titanium and a layer of titanium nitride;
   e) a layer of capacitor dielectric disposed on said first layer of conductive material in contacting relation with said layer of titanium nitride;
   f) a third layer of metal disposed on said layer of capacitor dielectric;
   g) a fourth layer of metal disposed on said second layer of conductive material.

2. The integrated circuit of claim 1 wherein said third and fourth layers of metal comprise aluminum.

3. The integrated circuit of claim 1 wherein said first and second layers of conductive material are separated by an interlevel dielectric.

4. The integrated circuit of claim 1 wherein said capacitor dielectric comprises silicon dioxide.

* * * * *